(12) United States Patent
Eriksson et al.

(10) Patent No.: US 11,487,137 B2
(45) Date of Patent: Nov. 1, 2022

(54) EYEWEAR WITH WIRELESS CHARGING MEANS

(71) Applicant: SKUGGA TECHNOLOGY AB, Stockholm (SE)

(72) Inventors: Jonas Eriksson, Huddinge (SE); Mikael Eriksson, Hägersten (SE); Daniel Eriksson, Stockholm (SE); Fredrik Hanson, Stockholm (SE); Kristina Ahlinder, Stockholm (SE); Tony Larsson, Stockholm (SE)

(73) Assignee: SKUGGA TECHNOLOGY AB, Stockholm (SE)

( * ) Notice: Subject to any disclaimer, the term of this patent is extended or adjusted under 35 U.S.C. 154(b) by 554 days.

(21) Appl. No.: 16/493,424

(22) PCT Filed: Mar. 13, 2018

(86) PCT No.: PCT/SE2018/050241
§ 371 (c)(1),
(2) Date: Sep. 12, 2019

(87) PCT Pub. No.: WO2018/169475
PCT Pub. Date: Sep. 20, 2018

(65) Prior Publication Data
US 2020/0133030 A1 Apr. 30, 2020

(30) Foreign Application Priority Data
Mar. 13, 2017 (SE) .................................... 1750283-2

(51) Int. Cl.
*G02C 11/00* (2006.01)
*H02J 50/10* (2016.01)
(Continued)

(52) U.S. Cl.
CPC ............. *G02C 11/10* (2013.01); *H01F 38/14* (2013.01); *H02J 7/0044* (2013.01); *H02J 50/10* (2016.02); *H05K 1/165* (2013.01)

(58) Field of Classification Search
CPC ......... G02C 11/10; H02J 50/10; H02J 7/0044; H01F 38/14; H05K 1/165
(Continued)

(56) References Cited

U.S. PATENT DOCUMENTS 7,648,236 B1 * 1/2010 Dobson .................. G02C 11/06
351/158
9,472,340 B2 * 10/2016 Park ...................... H01F 41/041
(Continued)

FOREIGN PATENT DOCUMENTS

CN 202003089 U 10/2011
CN 105700197 A 6/2016
(Continued)

OTHER PUBLICATIONS

European Search Report for corresponding European Application No. 18767987.3, dated Mar. 4, 2020, 8 pages.
(Continued)

*Primary Examiner* — Alfonso Perez Borroto
(74) *Attorney, Agent, or Firm* — Tucker Ellis LLP

(57) ABSTRACT

Eyewear (100) comprising at least one lens (110,120), a lens frame (111,121), a battery (170) and means for wireless charging of said battery (170), which wireless charging means comprises a receiver coil (181) arranged to be remotely powered by a corresponding transmitter coil (340) in a separate charging device (300). The invention is characterised in that the receiver coil (181) is arranged so that it encircles at least one of said one or several lenses (110,120), forming part of or being enclosed in said lens frame (111,
(Continued)

121), whereby light passing through the at least one lens (110,120) will also pass through a coil hole.

17 Claims, 5 Drawing Sheets

(51) Int. Cl.
    *H01F 38/14* (2006.01)
    *H02J 7/00* (2006.01)
    *H05K 1/16* (2006.01)
(58) Field of Classification Search
    USPC .......................................................... 351/158
    See application file for complete search history.

(56) References Cited

U.S. PATENT DOCUMENTS

| | | | |
|---|---|---|---|
| 9,606,358 B1* | 3/2017 | Heinrich | G02B 27/0179 |
| 2005/0275714 A1* | 12/2005 | Ishikawa | A61B 5/117 |
| | | | 348/14.02 |
| 2008/0198324 A1* | 8/2008 | Fuziak | G02C 5/001 |
| | | | 351/158 |
| 2010/0110368 A1* | 5/2010 | Chaum | G02C 11/10 |
| | | | 351/158 |
| 2013/0188080 A1* | 7/2013 | Olsson | G06F 1/163 |
| | | | 381/151 |
| 2014/0168349 A1* | 6/2014 | Eom | H04R 29/001 |
| | | | 348/14.03 |
| 2015/0372532 A1 | 12/2015 | Hatanaka et al. | |

FOREIGN PATENT DOCUMENTS

| | | |
|---|---|---|
| EP | 2961033 A1 | 12/2015 |
| GB | 951607 A | 3/1964 |
| JP | 2011232550 A | 11/2011 |

OTHER PUBLICATIONS

International Search Report and Written Opinion from corresponding International Patent Application No. PCT/SE2018/050241, dated Jun. 1, 2018, 9 pages.

* cited by examiner

EYEWEAR WITH WIRELESS CHARGING MEANS

The present invention relates to a piece of eyewear, and in particular to an eyewear comprising a battery which can be charged via wireless inductive charging. Furthermore, the invention relates to a holder and charger for such eyewear.

To an increasing extent, electrically driven functionality is being used in various articles of clothing and accessories. Eyewear, such as glasses or spectacles, is no exception. For instance, known such functionality for eyewear comprises automatic shading of lenses. Such electrically driven functionality may be implemented using analogue circuitry and/or digitally implemented, electronic circuitry. In both cases, in general a battery is required to power the circuitry in question.

There is a problem charging such a battery. In particular, it is perceived as cumbersome to attach a cable to the eyewear for charging, not least since the eyewear may have rather fine geometric dimensions. Therefore, it is difficult to attach such a cable for charging. Also, when not worn, eyewear is commonly stored in places where such a cable-driven charger cannot easily be used, such as in a handbag. In addition, a charging plug is often perceived as aesthetically unattractive, and limits the design freedom of a designer.

The present invention solves this problem.

Hence, the invention relates to an eyewear comprising at least one lens, a lens frame, a battery and means for wireless charging of said battery, which wireless charging means comprises a receiver coil arranged to be remotely powered by a corresponding transmitter coil in a separate charging device, which eyewear is characterised in that the receiver coil is arranged so that is encircles at least one of said one or several lenses, forming part of or being enclosed in said lens frame, whereby light passing through the at least one lens will also pass through a coil hole (118e).

Furthermore, the herein a holder is disclosed for an eyewear of the said type, which holder comprises a transmitter coil arranged to power a corresponding receiver coil in said eyewear, and in that the holder comprises alignment means arranged to align the eyewear in a position allowing the said powering of the receiver coil by the transmitter coil.

In the following, the invention will be described in detail, with reference to exemplifying embodiments of the invention and to the enclosed drawings, wherein.

Figure 1:
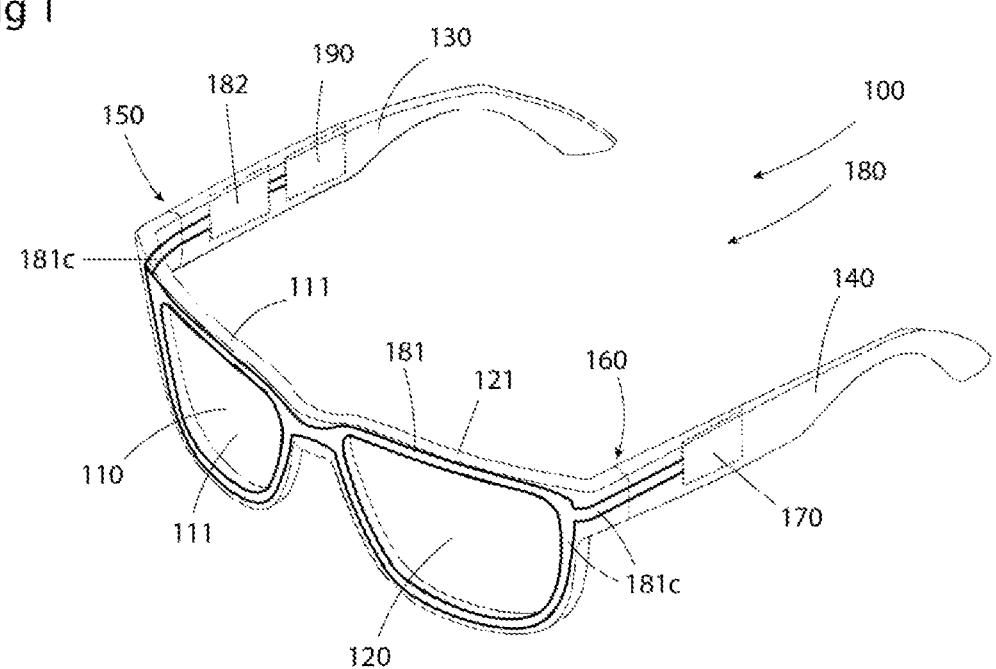
FIG. 1 is perspective view of an exemplifying piece of eyewear according to the present invention.
Figure 2:
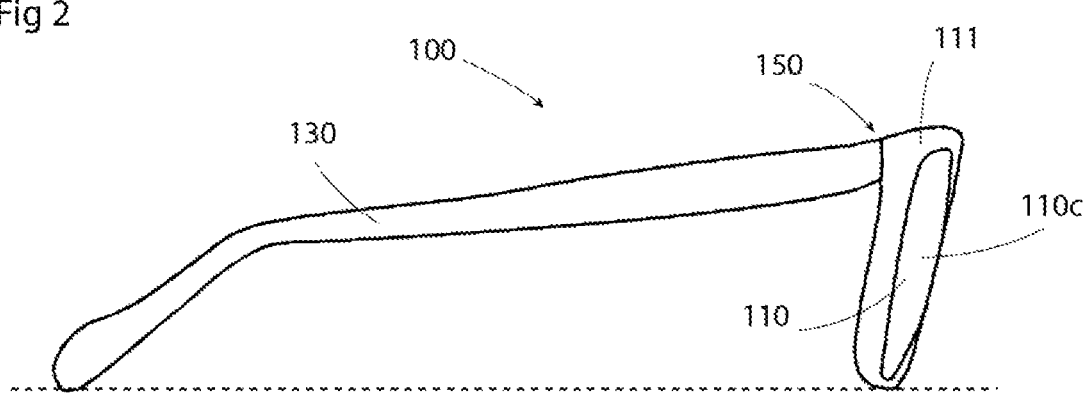
FIG. 2 is a side view of the eyewear shown in FIG. 1.

The figures share the same reference numerals for same or corresponding parts. In general, what is said regarding one illustrated set of eyewear is equally relevant, as applicable, to the other described pieces of eyewear. The same applies regarding the holder in FIGS. 4-5 vis-à-vis the various exemplifying pieces of eyewear.

The figures are simplified and in general not drawn to scale.

Figure 3A:
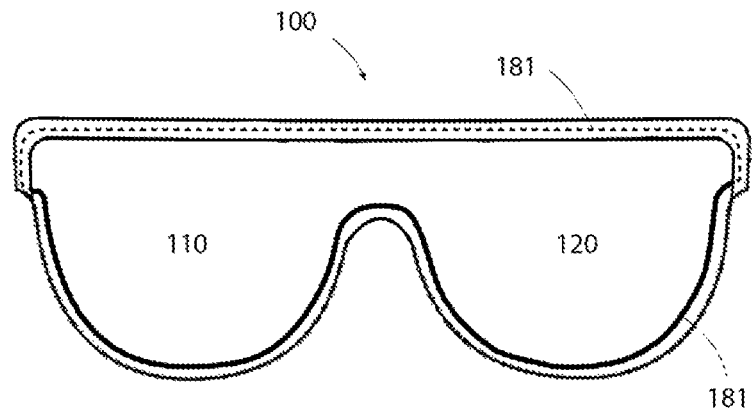
FIGS. 3a, 3b and 3c are respective front views of two different exemplifying pieces of eyewear according to the invention.

Hence, FIG. 1 illustrates a piece of eyewear 100, comprising two lenses 110, 120. According to the invention, the eyewear 100 comprises at least one such lens 110, 120. In FIG. 3a a pair of glasses is shown with only one lens, covering both the eyes of a user when in use. It is, however, noted that the present invention may also be applied to other types of eyewear, such as welding masks, monocles, ski goggles, etc., which types of eyewear may feature one or more (usually not more than two) lenses.

The eyewear 100 further comprises two lens frames 111, 121, typically each enclosing a respective lens 110, 120 in question. Similarly as regarding the lenses 110, 120 themselves, it is realized that there may be one or more lens frames 111, 121.

Furthermore, the eyewear 100 comprises a battery 170, arranged to power some electric or electronic functionality 190 used by the eyewear 100. Examples of such functionality include an automatic shading functionality of the lenses 110, 120; a sensor functionality in the eyewear 100 for sensing some environment parameter such as light or sound; a built-in image viewing device for showing an image to a user of the eyewear 100, and so on. What is important is that such functionality depends upon the battery 170 for power, why the battery 170 needs charging.

To this end, the eyewear 100 further comprises a battery charging means 180, and in particular a means 180 for wireless charging of the battery 170. The wireless charging means 180 comprises an inductive receiver coil 181, arranged to be remotely powered by a corresponding transmitter coil 340 in a separate charging device (see FIGS. 4 and 5), for instance in the form of a holder 300 for the eyewear 100.

According to the invention, the receiver coil 181 is arranged so that it encircles at least one of said one or several lenses 110, 120, forming part of or being enclosed in the respective lens frame 111, 121 in question, whereby light passing through the at least one lens 110, 120 will also pass through a coil hole.

Namely, the present inventors have realized that, by arranging the receiver coil around one or both of the lenses in a piece of eyewear, in particular in the preferred case of a pair of glasses or spectacles, it is possible to provide a powerful enough inductive coil so as to be able to develop a charging voltage which is sufficient to charge the battery 170 from a transmitter coil 340 as described herein. There are a number of ways to accomplish this, as is detailed in the following.

It is noted that a coil in general comprises one or several "coil hole". By this term is meant the main through hole through the coil, which all coil turns run around and define. This is also what the term "encircle" relates to that the individual coil turns run around the periphery of such one or several coil holes.

It is furthermore noted that not all light passing through the one or several lenses 110, 120 must pass through such a coil hole. However, it is preferred that at least half, preferably substantially all, of the light passing through the one or several lenses 110, 120 also passes through the coil hole. This can be accomplished by the coil being arranged in a lens 110, 120 plane, at or near the lens periphery, or substantially along an envelope surface defined by a cylinder defined by the lens 110, 120 in question in the sense that the lens 110, 120 circumference is a cross-section of such a cylinder.

In case of a wire coil, the coil turns can be wound around the lens or lenses 110, 120 in question. In case of a printed circuit, the coil turns can be printed in turns in a structure encircling the lens or lenses 110, 120.

In general, it is preferred that the receiver coil 181 comprises at the most 30, preferably at the most 20, preferably at the most 18, individual turns 181a. Also, it is preferred that the number of such turns 181a is at least 5, preferably at least 10, preferably at least 14. Such number of turns has proved to be both sufficient for providing power to the charged battery while still minimizing the total volume of the receiver coil 181, which is important for the presence of the coil 181 not deteriorating the design and/or function of the eye-wear.

Regarding the cross-sectional area of the coil conductor 181b, it is realized that the conductor 181b may include a single thread or cable for each turn, or alternatively that several smaller conductive strands may be arranged in parallel so as to form each turn (for instance in a so-called Litz wire, comprising several individual parallel-arranged threads together forming each turn). Irrespectively of the number of such individual strands or threads, it is preferred that the total cross-sectional area of a set of at least one coil conductor (that is, one single conductor or a set of parallel conductors) forming each individual turn in said receiver coil is at the most 0.03 mm$^2$, preferably at the most 0.02 mm$^2$. Also, it is preferred that said total cross-sectional area of each turn is at least 0.005 mm$^2$, preferably at least 0.01 mm$^2$.

However, in practise the number of turns and the total cross-sectional area depends upon the required voltage to charge the battery; the available power from the transmitter coil 340; the resistance of the coil 181 conductor material, and so on. In general, it is preferred that the inductance of the coil 181 is between 5 and 20 µH.

Preferably, the battery 170 is a lithium-ion battery, which requires at least about 4 V or slightly more for charging, why it is preferred that such a voltage is available from the receiver coil 181 when activated for charging in a predetermined geometric relation to a powered transmitter coil 340, and that all parts of the transmitter 300 and the eyewear 100 are dimensioned and arranged so as to allow such a voltage to be produced during charging.

In general, preferred materials for the receiver coil 181 conductors include various metals, such as stainless steels, copper or copper alloys and silver; carbon materials; and electrically conductive polymers, preferably flexible such polymers.

Furthermore, it is preferred that the receiver coil 181 forms part of or is enclosed by the lens frames 111, 121. Irrespectively of whether the receiver coil 181 is completely enclosed by the lens frames 111, 121 or not, it is preferred that the aggregate of both the lens frames 111, 121 and the receiver coil 181, at its thinnest point along the receiver coil 181, is no more than 6 by 6 mm of cross-section. Furthermore, it is preferred that the lenses 110, 120 are not flat, but curved about at least one, preferably two, curvature axes, and that the lens frames 111, 121 are correspondingly non-flat. As a result, the receiver coil 181 is preferably not flat, in the sense that it does not extend in a plane. This is most often required for applications with glasses or spectacles, such as reading glasses or sunglasses. The present invention, in its various embodiments, makes it possible to efficiently charge the battery 170 wirelessly, even with such a non-flat receiver coil 181.

According to one preferred embodiment, the conductors 181a forming the turns of the receiver coil 181 are metal wires, such as round profile steel or copper wires. In one preferred embodiment, apart from being arranged to receive inductively transferred electric energy from the transmitter coil 340, the receiver coil 181 then also forms a substantial structural stability element of the eyewear 100. This means that, without the receiver coil 181, the eyewear 100 would not have sufficient mechanical stability, such as bending resistance, for normal intended use. For instance, the receiver coil 181 may be encapsulated by a thin layer of plastic, whereby the receiver coil 181 forms the main structural element of the lens frames 111, 121, providing mechanical stability to the frames 111, 121 while the said plastic layer protects the receiver coil 181 and provides a desired aesthetic appearance. Another example is that the receiver coil 181 forms a visible part of the lens frames 111, 121, if this is desired from an aesthetica) point of view. The individual receiver coil 181 conductors may be insulated as required.

However, according to an alternative preferred embodiment, conductors 181b forming the turns of the receiver coil 181 are printed on a multilayer circuit 181c, which in turn is mounted in or on the eyewear 100, as an integrated part thereof. For instance, such a circuit 181c may be glued between two layers of the frame 111, 121, or be encapsulated by plastic material during the manufacturing process of the frame 111, 121.

Herein, the expression "multilayer circuit" refers to a circuit, such as a circuit board, 181c having more than one layer of conductors, where the layers are interconnected. Hence, each such layer then comprises one or several ones of said receiver coil turns 181a, and each layer is interconnected with its one or several neighbours so as to form the connected receiver coil 181. See FIG. 8 for an example.

Such multilayer circuits 181c are as such conventional, and are not described in any detail herein. However, it is noted that the substrate of such a circuit 181c may be a stiff material, such as comprising glass fibre material. In this case, the circuit 181c may form a stabilizing element with a function corresponding to the above described one, in terms of providing a substantial structural stability element of the eyewear 100.

However, in a preferred embodiment, the circuit 181c is a multilayer flexible printed circuit (FPC), in other words a printed multilayer circuit which is printed on a substrate which is flexible, making the resulting circuit flexible. Such a multilayer flexible printed circuit may also be or comprise a so called flat flexible cable (FFC) and/or a so called rigid-flex cable. What is important is that the circuit is at least partly flexible. Suitable substrate materials comprise films of polyester, polymide, polyethylene naphtalate, polyetherimide and fluoropolymers and copolymers. Such flexible printed circuits are as such well-known, and are used, for instance, in digital cameras and computer keyboards.

Figure 8:
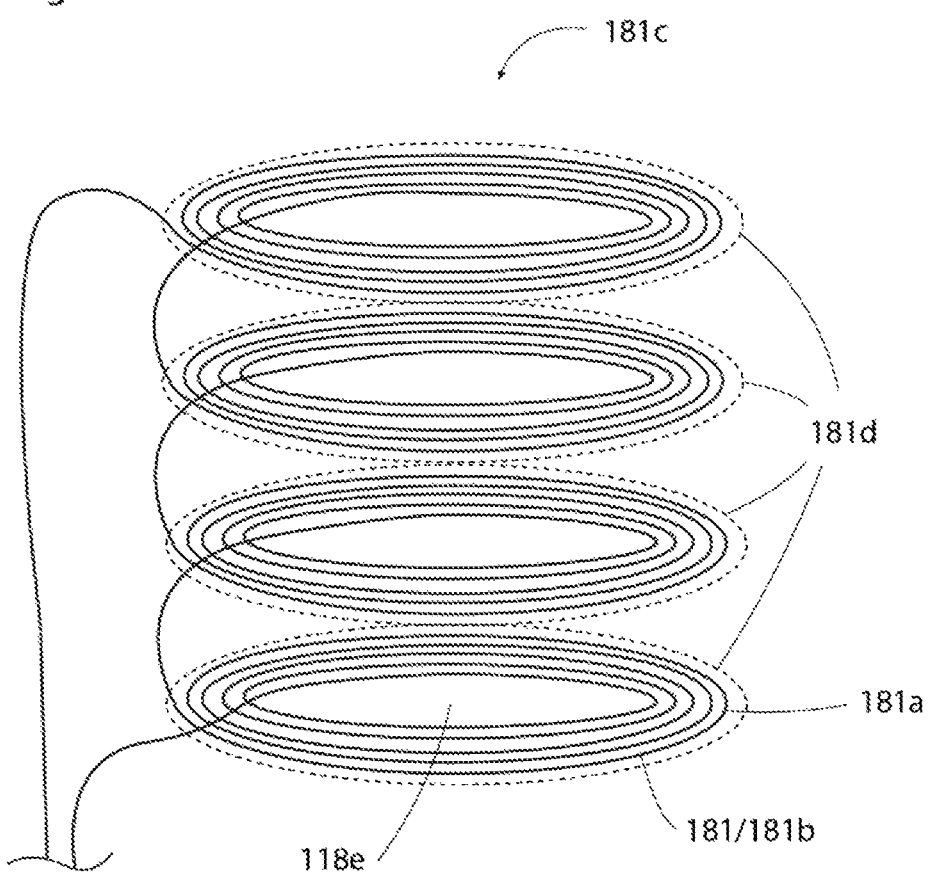
FIG. 8 is a simplified schema over a multilayer printed circuit with printed conduits.

For such a flexible multilayer circuits 181c, it is preferred that each individual conductor 181b, in cross-section, is between 0.02 and 0.05 mm thick, and between 0.1 and 2 mm wide, preferably between 0.1 and 0.6 mm wide. One preferred arrangement of the receiver coil 181 conductors 181b is one in which there are at least four layers 181d of at least four conductors 181b on each such layer, forming the receiver coil 181. This is illustrated in FIG. 8. Preferably, there are less than 10 layers carrying the receiver coil 181.

Using the present invention, it is possible to provide a receiver coil 181 which can be used for efficient wireless charging even in the case in which the lens frames 111, 121, along which frames 111, 121 the receiver coil 181 is arranged, has a local curvature radius of between 550-50 mm along the length of the receiver coil 181, which is preferred. It is noted that the lens 110, 120 itself may also have a certain curvature, which may be in addition to the curvature of the lens frames 111, 121 in question.

In particular when using a stiff or flexible printed circuit 181c, it is preferred that the lens frame 111, 121 curvature is approximated using a set of straight line segments, between 1 and 5 mm of length, which simplifies the design and manufacturing process.

In general, and in particular for the said flexible printed circuit 181c, it is preferred that the battery charging means 180 comprises circuitry 182 for providing a desired voltage to the battery 170. Furthermore, as mentioned above, the eyewear 100 also comprises circuitry 190 for performing other tasks, i.e. additional functionality. It is preferred that such circuitry 182, 190 is arranged in a temple 130, or different temples 130, 140, of the eye-wear 100, so that the said flexible printed circuit extends past a respective hinge 150, 160 of the eyewear 100. This way, the flexible printed circuit can extend, in one integrated piece, from the respective lens frame 111, 121 to a respective temple 130, 140, past the hinge 150, 160, without using connectors or the like, and still be able to deliver electric connectivity and power transfer across the hinge 150, 160 even when the hinge 150, 160 bends at different angles. This provides for a very low-cost production of the eyewear while still maintaining full flexibility in terms of functionality and geometric arrangement of the various parts 170, 180, 190 across the temples 130, 140. As described above, such flexible printed circuit 181c can also be designed so as to provide sufficient charging power while still not becoming too bulky to fit as a part of the lens frames 111, 121.

Figure 7:
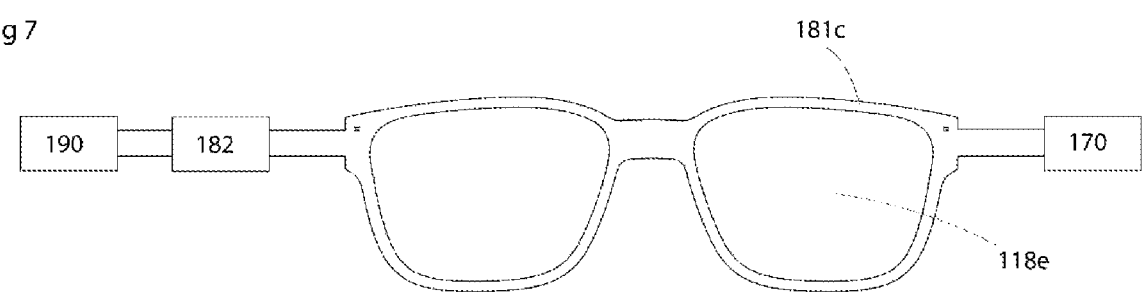
FIG. 7 is a simplified plan view of a multilayer printed circuit.

A simplified plan view of the outer shape of an exemplifying single flexible printed circuit 181c is illustrated in FIG. 7.

An exemplifying arrangement of components is illustrated in FIG. 1, where the battery 170 is arranged in one of the temples 140 while the additional circuitry 190 is arranged in the other temple 130. The battery charging circuitry 182 is also arranged in the other temple 130. Then, all these components 170, 182, 190 are electrically interconnected across both hinges 150, 160 by one or several flexible printed circuit of the above discussed kind, preferably a single such flexible printed circuit, which can be inexpensively mounted in one single step during manufacturing of the eyewear 100.

According to one preferred embodiment, the wireless charging means 180 further comprises a digital control means, which may be the same as the battery charging circuitry 182, arranged to control a power, a current and/or a voltage developed in the receiver coil 180. Then, the digital control means is preferably further arranged to transmit, digitally, information regarding a state of the eyewear 100, and in particular information regarding a current battery 170 charging state, to the transmitter coil 340 via modulation of the said power, current, voltage and/or frequency in a way which is detectable remotely by the transmitter coil 340 and associated circuitry in the charging device 300. Hence, in this case there is a digital communication, using a predetermined format and protocol, from the eyewear 100 to the charging device 300, for instance signalling that the battery 170 is fully charged. Examples of such communication standards comprise the one prescribed by the Qi standard for wireless charging.

Figure 3B:
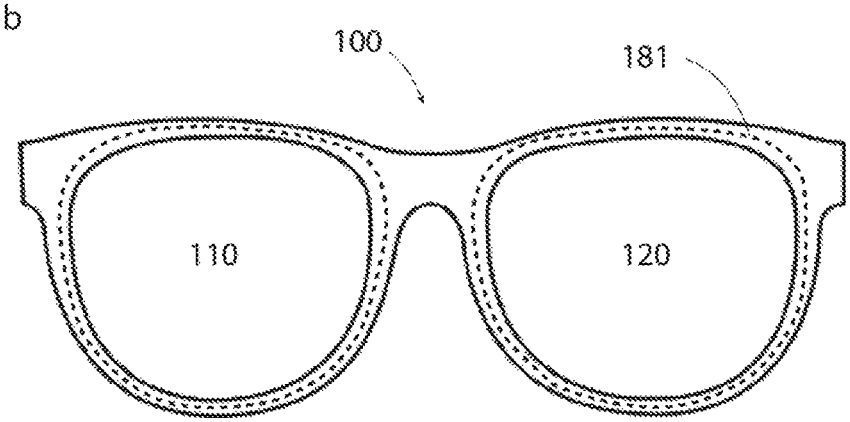
Figure 3C:
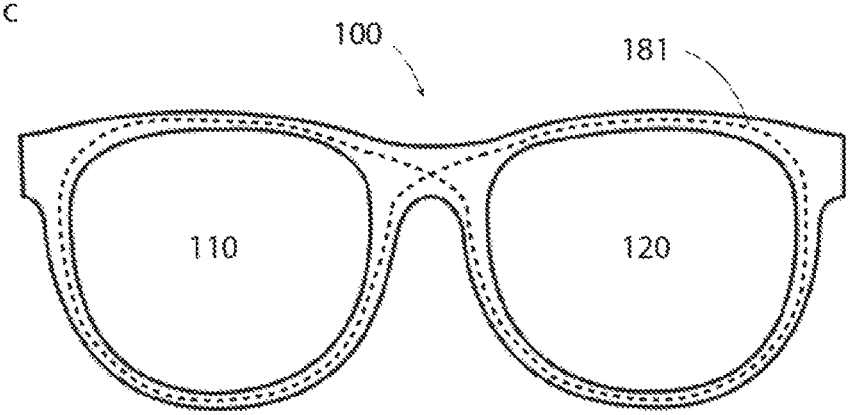

Further in the case when the eyewear 100 is a pair of glasses or spectacles, FIGS. 3a-3c illustrate different preferred arrangements of the receiver coil 181.

In FIG. 3b, the receiver coil 181 is arranged as two separate, but preferably electrically interconnected, coils around two different lenses 110, 120. In this case, the coils 181 may provide separate induced voltages to the battery charging circuitry 182, arranged to be inductively activated by two corresponding different transmitter coils 340, or together form one single coil.

In FIG. 3a, the receiver coil 181 is arranged as one single coil enclosing both lenses 110, 120 in a non-overlapping (without coil 181 conductor 181b crossings) manner. In fact, in FIG. 3a, the lenses 110, 120 are in fact only one, interconnected lens, which the coil 181 encircles as part of the lens frame 111, 121, which is, correspondingly, one single lens frame enclosing at least part of the single lens.

In FIG. 3c, the receiver coil 181 is arranged as one single coil enclosing both lenses 110, 120 in a figure-eight shape with coil overlap between the said two different lenses 110, 120.

It is noted that other examples are possible, such as one single lens with two coils, where a centre frame piece covers part of the coils (and the corresponding portion of the common lens). Furthermore, FIG. 3c could also use such a centre frame piece, so that one single lens could be used with a figure-eight shape.

In these and other cases, it is preferred that the circumference of the receiver coil 181 or each receiver coil 181 is between 100 and 400 mm.

Figure 6:
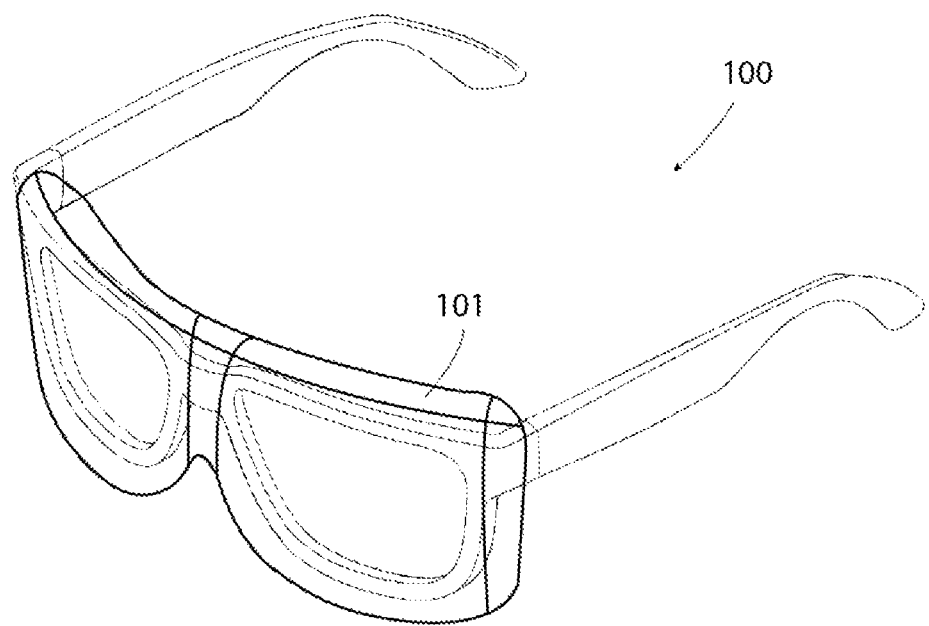
FIG. 6 is a perspective view of an eyewear of the invention with a detachable protection means.

FIG. 6 illustrates yet another preferred embodiment, according to which the eyewear 100 comprises a detachable protection means 101, arranged to be detachably attached, such as using a Velcro® flap, to the eyewear 100 so that it encloses at least one, preferably both, lenses 110, 120. In cases where the eyewear 100 only has one lens, this lens is then enclosed correspondingly. Preferably, the detachable protection means 101 covers the lenses 110, 120 in question snugly, so that the overall shape of the eyewear 100 is substantially unaffected by mounting the protection means 101 thereon. Then, the detachable protection means 101 comprises a material with high initial permeability, suitable for 100-130 kHz applications, such as an initial permeability of between 2000-3000 $Hm^{-1}$, preferably between 2300-2500 $Hm^{-1}$, providing electrical shielding to the receiver coil 181. Preferably, the shielding comprises a magnetic layer, such as ferrite, arranged along the lens 110, 120 in question when enclosed by the protective means 101, which increases charging efficiency and protects electronics in the eyewear 100, as well as externally arranged metal objects arranged close to the charging circuits, from thermal stress due to eddy currents within the metal material, during charging. The said layer may comprise a layer of magnetic powder, such as ferrite powder. Furthermore, the said layer may also comprise a layer of a non-magnetic metal foil, such as an aluminium foil. This way, necessary electrical shielding for complying with an existing wireless charging standard, such as the Qi standard mentioned above, can be achieved by the detachable protection means 101, and the protection means 101 is preferably mounted on the eyewear 100 when the latter is being charged. To the contrary, no such shielding would then be necessary at the lens frames 111, 121 themselves, providing more design freedom for the eyewear 100. This is the preferred case.

In particular, the protection means 101 can also be used only for lens 110, 120 protection when the eyewear 100 is not used. For this reason, it is preferred that the protection means 101 is not arranged to cover a temple 130, 140, or the temples 130, 140, but only both sides of the lenses 110, 120 and the lens frames 111, 121.

Preferably, the protection means 101 is entirely electrically passive, in the sense that it is not powered by an internal or external electric power source.

It is noted that such a protection means 101 could also be sold separately.

Figure 4:
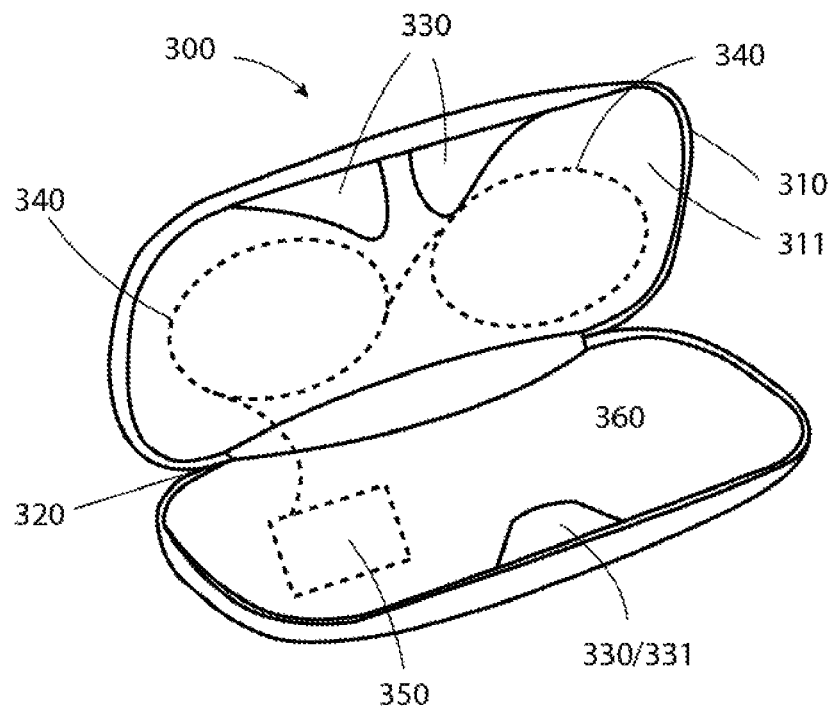
FIG. 4 is a perspective view of an exemplifying holder.
Figure 5:
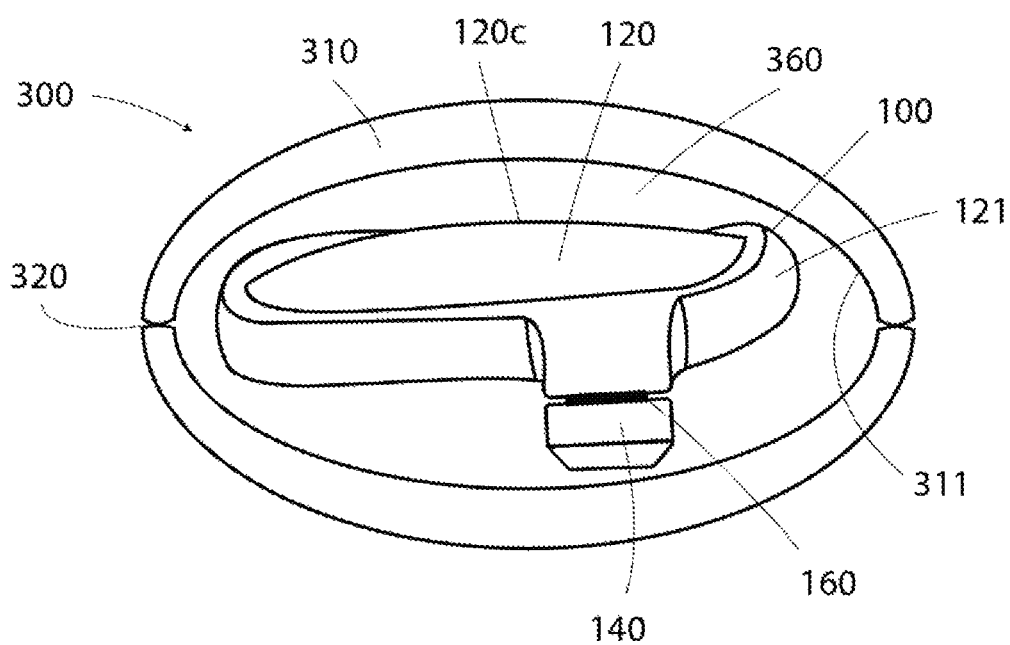
FIG. 5 is a cross-sectional view of the holder shown in FIG. 4 holding a piece of eyewear according to the present invention.

FIGS. 4 and 5 illustrate the above mentioned charging means, in the form of a holder 300 for the eyewear 100. It is noted that the eyewear 100 is specifically designed for being held by the holder 300, and for being wirelessly charged therefrom when being held, and/or that the holder 300 is specifically designed for holding the eyewear 100 therein and wirelessly charging the eyewear 100 when being held therein.

The holder 300 comprises a transmitter coil 340, arranged to power the corresponding receiver coil 181 in the eyewear 100. As discussed above, several transmitter coils may also be arranged to power several corresponding receiver coils, as the case may be. Furthermore, the holder 300 comprises alignment means 330 arranged to align the eyewear in a position allowing the said powering of the receiver coil 181 by the transmitter coil 340. Such alignment means 330 may be in the form of an accommodating space 360 inside the holder 300 being small enough and shaped so as to not allow the eyewear 100 to be oriented in a way not enabling wireless charging when the eyewear 100 is accommodated in the holder 300. However, it is preferred that specific internal geometric details inside the accommodating space 360 are designed to correspond to specific external geometric details of the eyewear 100, such as around the location where two lens frames 111, 121 meet on the eyewear 100, so that it is impossible for the holder 300 to fully accommodate the eyewear 100 unless properly oriented in the holder 300. For this purpose, it is also preferred that the holder 300 can be opened and closed, such as using a lid 310 with a hinge 320, which lid 310 cannot be completely closed unless the eyewear is properly oriented in the holder 300.

This allows for the transmitter coil 340 to be very precisely oriented in relation to the receiver coil 181 when the eyewear 100 is accommodated in the holder 300, providing prerequisites for efficient, low-loss charging.

Preferably, the holder 300 is arranged to, during charging, apply an alternating current through the transmitter coil 340.

In general, the holder 300 may be a glasses or spectacle case, arranged for storing the glasses or spectacles 100 when not used, and at the same time doubling as a charging station.

The holder 300 comprises a power supply 350, which may comprise or be connectable to a wall socket connector, a transformer, and so forth. It is furthermore preferred that the power supply 350 comprises a battery, so that the holder 300 does not have to be connected to a wall socket in order to charge the eyewear 100. The holder 300 battery preferably has a capacity which is at least twice, preferably at least five times, that of the eyewear 100 battery 170.

Regarding the alignment means 330, these preferably further comprise an activating means 331 arranged to be activated when the eyewear 100 is correctly positioned for charging in the holder 300. The activating means 331 may, for instance, be in the form of a mechanically operating pushbutton which is pressed in as a result of the lid 310 being closed with the eyewear 100 accommodated in the holder 100. Alternatively, the activating means 331 may comprise an open electric circuit, arranged to be shortcut by corresponding electric connectors arranged on the eyewear 100 when the eyewear 100 is positioned in the correct orientation in the holder 100, or a combination of these and/or any number of as such conventional options to this end. Then, the holder 300 is arranged to initiate wireless charging of the eyewear 100 automatically, in reaction to the activating means 331 being activated.

It is noted that the receiver coil 181 is never put into direct electric contact with the transmitter coil 340 or the holder 300 power supply 350, and that all charging of the eyewear 100 battery 170 is always conducted wirelessly.

In FIG. 4, the holder 300 is shown in an opened state. In FIG. 5, the cross-section shows the holder 300 with the eyewear 100 in the correct charging orientation inside the closed holder 300, during wireless charging of the eyewear 100.

Specifically in the case in which the holder 300 comprises the said lid 310, it is preferred that the holder 300 is arranged to accommodate the eyewear 100 in the said correct charging orientation, in which a forward-facing lens side 110c of the eyewear (the side of the lens facing away from the user's eye during normal use) faces an interior side 311 of the lid 310. Then, the transmitter coil 340 is arranged in the lid 310 so that, when the eyewear 100 is accommodated in the holder 300 and the lid 310 is fully closed, the transmitter coil 340 is arranged at a distance of maximally 1 cm, preferably maximally 0.6 cm, from the receiver coil 181 and substantially parallel to the receiver coil 181.

Above, preferred embodiments have been described. However, it is apparent to the skilled person that many modifications can be made to the disclosed embodiments without departing from the basic idea of the invention.

For instance, the invention may be applied to many types of eyewear apart from the glasses shown in the Figures, and many different designs of glasses can also be provided with wireless charging functionality according to the present invention.

Also, the eyewear described herein can also be arranged for wireless or wired charging using other devices than the described holder 300 and flat-surface Qi chargers.

Hence, the invention is not limited to the described embodiments, but can be varied within the scope of the enclosed claims.

The invention claimed is:

1. Eyewear comprising:
a lens,
a non-flat lens frame that encircles a perimeter of the lens and is curved about an axis of curvature,
a battery, and
a wireless charger for the battery, the wireless charger comprising a receiver coil arranged to be remotely powered by a corresponding transmitter coil located in a separate charging device, and
wherein the receiver coil comprises conductors forming turns of the receiver coil that are printed on a multilayer flexible printed circuit (FPC), each layer of the FPC comprising plural turns of the receiver coil;
wherein the turns of the receiver coil encircle the lens and forms part of or is enclosed in the non-flat lens frame so that light passing through the lens also passes through a coil hole formed by the turns and so that the receiver coil is non-flat and curved with the non-flat lens frame about the axis of curvature.

2. The eyewear according to claim 1, wherein the receiver coil comprises no more than 20 turns, and wherein a total cross-sectional area of each turn is no more than 0.02 mm$^2$.

3. The eyewear according to claim 2, wherein the receiver coil comprises at least 10 turns, and wherein the total cross-sectional area of each turn is at least 0.01 mm$^2$.

4. The eyewear according to claim 1, wherein the conductors forming the turns of the receiver coil are metal wires that receive inductively transferred electric energy from said transmitter coil and form a structural stability element of the eyewear.

5. The eyewear according to claim 1, wherein the printed circuit comprises at least four layers.

6. The eyewear according to claim 1, wherein each individual conductor, in cross-section, is between 0.02 and 0.05 mm thick, and between 0.1 and 2 mm wide.

7. The eyewear according to claim 6, wherein the eyewear further comprises circuitry for providing a desired voltage to the battery and/or for performing a predetermined task, the circuitry is arranged in a temple of the eyewear, and the flexible printed circuit extends past a hinge of the eyewear connecting the non-flat lens frame to the temple.

8. The eyewear according to claim 1, wherein the wireless charger further comprises a digital controller that controls a power, a current and/or a voltage of electricity developed in the receiver coil, and further transmits information regarding a state of the eyewear to the transmitter coil via modulation of the power, the current, the voltage and/or a frequency of the electricity developed in the receiver coil.

9. The eyewear according to claim 1, the eyewear is a pair of glasses.

10. The eyewear according to claim 9, wherein the lens is a first lens and the eyewear comprises a separate second lens and the receiver coil comprises one of:
    two separate coils around the two different lenses of the eyewear;
    a single coil enclosing both lenses in a non-overlapping manner; or
    a single coil enclosing both lenses in a figure-eight shape with coil overlap between the two lenses.

11. The eyewear according to claim 1, wherein the eyewear further comprises a detachable protector that encloses the lens and provides electrical shielding to the receiver coil.

12. The eyewear according to claim 11, wherein the detachable protector does not cover a temple of the eyewear.

13. The eyewear according to claim 1, wherein the receiver coil comprises between 5 and 30 turns, and wherein a total cross-sectional area of each turn is between 0.005 mm$^2$ and 0.03 mm$^2$.

14. The eyewear according to claim 1, wherein the receiver coil comprises no more than 18 turns, and wherein a total cross-sectional area of each turn is no more than 0.02 mm$^2$.

15. The eyewear according to claim 14, wherein the receiver coil comprises at least 14 turns, and wherein the total cross-sectional area of each turn is at least 0.01 mm$^2$.

16. The eyewear according to claim 1, wherein each individual conductor, in cross-section, is between 0.02 and 0.05 mm thick, and between 0.1 and 0.6 mm wide.

17. The eyewear according to claim 1, further comprising charging circuitry that communicates via the receiver coil with the transmitter coil using a communications standard for wireless charging.

* * * * *